US012595387B2

(12) United States Patent
Lee et al.

(10) Patent No.: US 12,595,387 B2
(45) Date of Patent: Apr. 7, 2026

(54) INK COMPOSITION FOR LIGHT-EMITTING DEVICE AND LIGHT-EMITTING DEVICE MANUFACTURED BY USING THE SAME

(71) Applicant: Samsung Display Co., Ltd., Yongin-si (KR)

(72) Inventors: Sangyeop Lee, Yongin-si (KR); Jongwoo Shin, Yongin-si (KR); Dukki Kim, Yongin-si (KR); Sehun Kim, Yongin-si (KR); Wonjun Park, Yongin-si (KR); Jaekook Ha, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 649 days.

(21) Appl. No.: 18/172,286

(22) Filed: Feb. 21, 2023

(65) Prior Publication Data

US 2023/0265306 A1 Aug. 24, 2023

(30) Foreign Application Priority Data

Feb. 22, 2022 (KR) ........................ 10-2022-0023133

(51) Int. Cl.
*C09D 11/50* (2014.01)
*B82Y 30/00* (2011.01)
(Continued)

(52) U.S. Cl.
CPC .............. *C09D 11/50* (2013.01); *B82Y 30/00* (2013.01); *C09D 11/033* (2013.01); *C09K 11/55* (2013.01); *H10K 50/115* (2023.02); *H10K 50/16* (2023.02)

(58) Field of Classification Search
CPC .... C09D 11/50; C09D 11/033; H10K 50/115; H10K 50/16; B82Y 30/00; C09K 11/55
(Continued)

(56) References Cited

U.S. PATENT DOCUMENTS

2019/0002722 A1* 1/2019 May ..................... H10K 85/115
2019/0143715 A1* 5/2019 Ohnishi ................. B41J 2/2107 347/16
(Continued)

FOREIGN PATENT DOCUMENTS

CN 109181414 A 1/2019
CN 111393908 A 7/2020
(Continued)

OTHER PUBLICATIONS

Clara Guglieri, et al., In-Situ Structural Study of the Synthesis of ZnONanoparticles and the Adsorption Process of Thiol Ligands, J. Phys. Chem. C 2017, 121, 14083-14087.
(Continued)

*Primary Examiner* — Anita Nassiri-Motlagh
(74) *Attorney, Agent, or Firm* — CANTOR COLBURN LLP

(57) ABSTRACT

An ink composition for a light-emitting device, the ink composition including: a metal oxide; and a mixed solvent composition including a first solvent, a second solvent, and a third solvent, wherein the first solvent includes one hydroxyl group and has a boiling point of 160° C. to 270° C., the second solvent includes one hydroxyl group and has a boiling point of 270° C. to 350° C., and the third solvent includes two or more hydroxyl groups and has a boiling point of 270° C. to 350° C.

20 Claims, 2 Drawing Sheets

(51) Int. Cl.

| | |
|---|---|
| ***C09D 11/033*** | (2014.01) |
| ***C09K 11/55*** | (2006.01) |
| ***H10K 50/115*** | (2023.01) |
| ***H10K 50/16*** | (2023.01) |

(58) Field of Classification Search

USPC .................................................. 252/301.4 R

See application file for complete search history.

(56) References Cited

U.S. PATENT DOCUMENTS

| | | | | |
|---|---|---|---|---|
| 2019/0276696 | A1 | 9/2019 | Pan et al. | |
| 2020/0136046 | A1 * | 4/2020 | Béalle | H10K 71/15 |
| 2023/0025948 | A1 | 1/2023 | Kim et al. | |
| 2023/0038085 | A1 | 2/2023 | Doh et al. | |

FOREIGN PATENT DOCUMENTS

| | | | |
|---|---|---|---|
| CN | 111584731 | A | 8/2020 |
| CN | 115548225 | A | 12/2022 |
| CN | 115623824 | A | 1/2023 |
| KR | 1020230001612 | A | 1/2023 |

OTHER PUBLICATIONS

Dazhi Sun, et al., Transparent PMMA/ZnO nanocompositefilms based on colloidal ZnO quantum dots, Nanotechnology 2007, 18, 215606, 6 pp.

English Abstract of CN 109181414.

English Abstract of CN 111393908.

English Abstract of CN 111584731.

Yao Tu, et al., Transparent and flexible thin films of ZnO—polystyrene nanocompositefor UV-shielding applications:, J. Mater. Chem., 2010, 20, 1594-1599.

* cited by examiner

INK COMPOSITION FOR LIGHT-EMITTING DEVICE AND LIGHT-EMITTING DEVICE MANUFACTURED BY USING THE SAME

CROSS-REFERENCE TO RELATED APPLICATION

This application is claims priority to Korean Patent Application No. 10-2022-0023133, filed on Feb. 22, 2022, in the Korean Intellectual Property Office, and all the benefits accruing therefrom under 35 U.S.C. § 119, the disclosure of which in its entirety is incorporated by reference herein.

BACKGROUND

1. Field

One or more embodiments relate to an ink composition for a light-emitting device and a light-emitting device using the ink composition in the manufacture of the device.

2. Description of the Related Art

A light-emitting device includes a plurality of organic and/or inorganic films stacked between an anode and a cathode, and the materials used for forming the organic and/or inorganic films include polymer materials, low molecular weight materials, and/or metal oxides.

When a metal oxide is used for a layer in contact with the electrode, controlling the degree of adhesion to the electrode and the rate of charge transfer across the metal oxide can play an important role in the efficiency and lifespan of the device.

SUMMARY

Provided is an ink composition for a light-emitting device having an improved thickness profile, and a light-emitting device using the ink composition in the manufacture of the device.

Additional aspects will be set forth in part in the description which follows and, in part, will be apparent from the description, or may be learned by practice of the presented embodiments of the disclosure.

According to one or more embodiments, provided is an ink composition for a light-emitting device, the ink composition including a metal oxide, and a mixed solvent of a first solvent, a second solvent, and a third solvent, wherein the first solvent may include one hydroxyl group and have a boiling point of 160° C. to 270° C., the second solvent may include one hydroxyl group and have a boiling point of 270° C. to 350° C., and the third solvent may include two or more hydroxyl groups and have a boiling point of 270° C. to 350° C.

According to one or more embodiments, provided is a light-emitting device including a first electrode, a second electrode facing the first electrode, and an interlayer arranged between the first electrode and the second electrode, the interlayer including an emission layer, wherein a layer of the interlayer may be prepared by using the ink composition for the light-emitting device.

According to one or more embodiments, provided is an electronic apparatus including the light-emitting device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
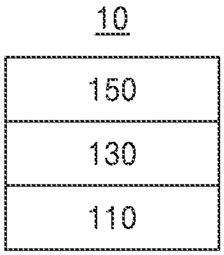
FIG. 1 is a schematic view of a structure of a light-emitting device according to an embodiment.

Reference will now be made in detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the drawings, to explain aspects of the present description.

The terminology used herein is for the purpose of describing particular embodiments only and is not intended to be limiting. As used herein, the singular forms “a,” “an,” and “the” are intended to include the plural forms, including “at least one,” unless the content clearly indicates otherwise. “At least one” is not to be construed as limiting “a” or “an.” “Or” means “and/or.” As used herein, the term “and/or” includes any and all combinations of one or more of the associated listed items. It will be further understood that the terms “comprises” and/or “comprising,” or “includes” and/or “including” when used in this specification, specify the presence of stated features, regions, integers, steps, operations, elements, and/or components, but do not preclude the presence or addition of one or more other features, regions, integers, steps, operations, elements, components, and/or groups thereof. Throughout the disclosure, the expression “at least one of a, b, or c” indicates only a, only b, only c, both a and b, both a and c, both b and c, all of a, b, and c, or variations thereof.

It will be understood that, although the terms first, second, etc. may be used herein to describe various elements, components, regions, layers and/or sections, and these elements, components, regions, layers and/or sections should not be limited by these terms. These terms are only used to distinguish one element component, region, layer, or section from another element, component, region, layer, or section. Thus, “a first element,” “component,” “region,” “layer” or “section” discussed below could be termed a second element, component, region, layer, or section without departing from the teachings herein.

It will be understood that when a layer, region, or component is referred to as being “on” or “onto” another layer, region, or component in the present specification, it may be directly or indirectly formed on the other layer, region, or component. That is, for example, intervening layers, regions, or components may be present.

It will be understood that when a layer, region, or component is referred to as being “connected to” another layer, region, or component, the layer, region, or component may be directly connected to another layer, region, or component, and/or indirectly connected to another layer, region, or component as intervening layer, region, or component is present. For example, it will be understood that when a layer, region, or component is referred to as being "electrically connected to" another layer, region, or component, the layer, region, or component may be directly electrically connected to another layer, region, and/or component, or indirectly electrically connected to another layer, region, or component as intervening layer, region, or component is present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

For inorganic materials, for example, metal oxides, ligands such as amines, acids, and thiols and/or polymers may be used to modify the surface of inorganic materials. For example, a ZnO surface is more readily dispersed in a hydrophilic solvent having a hydroxyl group resulting from a strong surface binding or interaction of the hydroxyl group and/or acetate group with the ZnO surface.

In a case where a layer including an inorganic material, for example, a metal oxide, is formed in a light-emitting device by using a solution process, when inorganic material particles are dispersed in a solvent, applied to a surface and the applied dispersion is dried, a coffee ring-like phenomenon may occur due to capillary flow to a perimeter edge, which after drying results in a thickness profile in which the perimeter edge is thicker than the center, i.e., the applied and dried dispersion has a concave-like thickness profile.

An ink composition for a light-emitting device, which has little or no coffee ring-like phenomenon and which after drying has a relatively similar thickness profile from a center to a perimeter edge is desired, e.g. when the ink composition is used in the manufacture of a device such as a light emitting device.

According to one or more embodiments, an ink composition for a light-emitting device may include: a metal oxide; and a mixed solvent composition of a first solvent, a second solvent, and a third solvent, wherein the first solvent may include one hydroxyl group and have a boiling point of about 160° C. to about 270° C., the second solvent may include one hydroxyl group and have a boiling point of about 270° C. to about 350° C., and the third solvent may include two or more hydroxyl groups and have a boiling point of about 270° C. to about 350° C.

In an embodiment, a viscosity (at 25° C.) of the first solvent may be in a range of about 1 centipoise (cP) to about 10 cP.

In an embodiment, a viscosity (at 25° C.) of the second solvent may be in a range of about 1 cP to about 20 cP.

In an embodiment, a viscosity (at 25° C.) of the third solvent may be in a range of about 50 cP to about 10,000 cP.

In a mixed solvent composition, the first solvent, the second solvent, and the third solvent has a boiling point and a viscosity in the ranges described above, and thus, for example, after the first solvent having a relatively low boiling point evaporates the second solvent and the third solvent is still present.

In an embodiment, when only the first solvent and the second solvent are mixed, only the second solvent remains after evaporation of the first solvent, and a relative increase in viscosity is less likely to occur or be induced. In an embodiment, when only the second solvent and the third solvent are mixed, a jettable viscosity of the general-purpose Piezo inkjet head is exceeded, and ink drop instability may occur during a jetting process. In an embodiment, when only the first solvent and the third solvent are mixed, only the third solvent remains after evaporation of the first solvent, and the solubility of a metal particle in the remaining third solvent may rapidly decrease, thereby forming a defect referred to as a gel particle.

In an embodiment, a viscosity (at 25° C.) of the mixed solvent composition including the first solvent, the second solvent, and the third solvent may be in a range of about 1 cP to about 12 cP.

When the ink composition for the making of a light-emitting device is applied in a solution process, for example, when the ink composition is applied or sprayed by inkjet, a viscosity (at 25° C.) of the mixed solvent composition of the first solvent, the second solvent, and the third solvent may be in a range of about 1 cP to about 12 cP to facilitate jetting of the ink composition. When a viscosity of the mixed solvent composition of the first solvent, the second solvent, and the third solvent is greater than about 12 cP, there may be a problem in jetting of the ink composition, e.g., in an ink-jet process.

In an embodiment, a viscosity (at 25° C.) of a mixed solvent of the second solvent and the third solvent may be in a range of about 20 cP to about 1,000 cP. After the ink composition is applied by ink-jet (jetted) as a layer for the light-emitting device, the first solvent having a boiling point initially evaporates in a drying process, and the second solvent and the third solvent remain.

In this case, when a viscosity (at 25° C.) of a mixed solvent composition of the second solvent and the third solvent is in a range of about 20 cP to about 1,000 cP, capillary flow to the perimeter edge is reduced, and thus, a coffee ring-like phenomenon is less likely to occur or it may not occur at all. Therefore, a thickness profile of the dried dispersion may be similar, or substantially the same, from the center to the perimeter edge.

In an embodiment, an amount of the first solvent in the mixed solvent composition of the first solvent, the second solvent, and the third solvent may be in a range of about 50 volume percent (vol %) to about 75 vol %. When an amount of the first solvent in the mixed solvent composition of the first solvent, the second solvent, and the third solvent is less than about 50 vol %, a difference between a first drop and a second drop in ink drop evaluation may be greater than about 10 μm. When an amount of the first solvent is less than about 50 vol %, and thus, the volume percent of a total amount of the second and third solvent is greater than 50 vol %, the high viscosity of a solvent composition increases, and though jetting may still be possible, but due to the relative increase in initial viscosity during the printing process, the degree of ink drop placement precision decreases.

A volume ratio of the second solvent to the third solvent may be in a range of, for example, about 9:1 to about 100:1. In an embodiment, a volume ratio of the second solvent to the third solvent may be in a range of about 8:2 to about 99:1. When a volume ratio of the second solvent to the third solvent is in the range, a viscosity of the mixed solvent after the first solvent evaporates during a drying process may be minimize the occurrence of the coffee ring-like phenomenon.

In an embodiment, the first solvent may include 4 to 15 carbon atoms and 1 to 3 oxygen atoms (excluding the oxygen of the one hydroxy group). In an embodiment, the first solvent may be a compound including a hydrocarbon moiety, an ether moiety, and an alcohol moiety, and may include 4 to 15 carbon atoms and 1 to 3 oxygen atoms (excluding the oxygen of the one hydroxy group). A hydrocarbon of the hydrocarbon moiety may be a saturated hydrocarbon, and may be a linear or branched saturated hydrocarbon.

In an embodiment, the first solvent may include 3-methoxy 3-methyl butanol, 3-methoxy butanol, ethylene glycol monobutyl ether, ethylene glycol monoisobutyl ether, ethylene glycol mono t-butyl ether, ethylene glycol monopentyl ether, ethylene glycol monohexyl ether, ethylene glycol monoheptyl ether, ethylene glycol monooctyl ether, diethylene glycol monomethyl ether, diethylene glycol monoethyl ether, diethylene glycol monoisopropyl ether, diethylene glycol monopropyl ether, diethylene glycol monobutyl ether, diethylene glycol monoisobutyl ether, diethylene glycol mono t-butyl ether, diethylene glycol monopentyl ether, diethylene glycol monohexyl ether, diethylene glycol monoheptyl ether, diethylene glycol monooctyl ether, propylene glycol monopentyl ether, propylene glycol monohexyl ether, propylene glycol monoheptyl ether, propylene glycol monooctyl ether, propylene glycol mono 2-ethylhexyl ether, dipropylene glycol monomethyl ether, dipropylene glycol monopropyl ether, dipropylene glycol monoisopropyl ether, dipropylene glycol monobutyl ether, dipropylene glycol monoisobutyl ether, dipropylene glycol mono t-butyl ether, dipropylene glycol monopentyl ether, dipropylene glycol monohexyl ether, triethylene glycol monomethyl ether, triethylene glycol monoethyl ether, triethylene glycol monopropyl ether, triethylene glycol monoisopropyl ether, or any combination thereof.

In an embodiment, the second solvent may include 8 to 18 carbon atoms and 2 or 3 oxygen atoms (excluding the oxygen of the one hydroxy group). In an embodiment, the second solvent may be a compound including a hydrocarbon moiety, an ether moiety, and an alcohol moiety, and may include 8 to 18 carbon atoms and 2 or 3 oxygen atoms (excluding the oxygen of the one hydroxy group). A hydrocarbon of the hydrocarbon moiety may be a saturated hydrocarbon, and may be a linear or branched saturated hydrocarbon.

In an embodiment, the second solvent may include diethylene glycol 2-ethylpentyl ether, diethylene glycol 1-ethylbutyl ether, diethylene glycol 2-ethylhexyl ether, triethylene glycol monobutyl ether, triethylene glycol monopentyl ether, triethylene glycol monohexyl ether, triethylene glycol monoheptyl ether, triethylene glycol monooctyl ether, triethylene glycol 2-ethylhexyl ether, triethylene glycol 1-ethylpentyl ether, triethylene glycol 1-ethylbutyl ether, dipropylene glycol heptyl ether, dipropylene glycol octyl ether, dipropylene glycol heptyl ether, dipropylene glycol 2-ethylhexyl ether, dipropylene glycol 1-ethylpentyl ether, dipropylene glycol 1-ethylbutyl ether, or any combination thereof.

In an embodiment, the third solvent may include glycerin, solbitol (also known as sorbitol), polyethylene glycol (molecular weight of 400-1,100 g/mol), tetraethylene glycol, or any combination thereof.

In an embodiment, a metal of the metal oxide may include an alkaline earth metal, a transition metal, a post-transition metal, or any combination thereof.

In an embodiment, the metal oxide may include ZnO, ZnMgO, $MoO_3$, NiO, $Ni_2O$, $Ni_4O$, $Ni_3O$, $Ni_3O_4$, $Ni_2O_3$, $TiO_2$, $SnO_2$, $Cu_2O$, CuO, $Cu_2O_3$, or any combination thereof.

The metal oxide may have the form of particles. In an embodiment, an average particle size of the metal oxide particles may be in a range of about 10 nm to about 50 nm.

In an embodiment, a concentration of the metal oxide particles in the ink composition may be in a range of about 0.01 weight percent (wt %) to about 5 wt %. In an embodiment, a concentration of the metal oxide particles in the ink composition for the light-emitting device may be about 0.1 wt % to about 3 wt % based on the total weight of the composition including the solvent composition. When a concentration of the metal oxide particles in the ink composition for the light-emitting device is in the range, for example, coating by inkjet may be facilitated, and a metal oxide layer formed by the evaporating (removing) of the solvent from the composition by baking may provide a relatively uniform thickness profile.

Because the ink composition for the light-emitting device according to an embodiment has a low concentration of metal oxide particles of about 0.01 wt % to about 5 wt %, a viscosity of a solvent may be determinative in a viscosity of the ink composition for the light-emitting device. In an embodiment, a concentration of the ink composition for the light-emitting device according to an embodiment may be similar to a viscosity of the mixed solvent composition of the first solvent, the second solvent, and the third solvent. In an embodiment, a concentration of the ink composition for the light-emitting device according to an embodiment of the disclosure may be similar to the viscosity of the mixed solvent composition of the first solvent, the second solvent, and the third solvent.

In an embodiment, a viscosity at a point when the ink composition is dried under 0.1 Torr to reach about 25% to about 33% of the initial volume of the ink composition may be in a range of about 20 cP to about 1,200 cP. During a drying process, a solvent having a low boiling point, for example, the first solvent, evaporates, and the second solvent and the third solvent remain. During the drying process, the ink composition for the light-emitting device according to an embodiment may have a viscosity of about 20 cP to about 1,200 cP at a point when about 25% to about 33% (for example, 25% or 33%) of the initial volume of the ink composition is reached. As a result, capillary flow to the perimeter edge is reduced, and thus, a coffee ring-like phenomenon is minimized, and a thickness profile from the center to the perimeter edge may exhibit greater uniformity, e.g., be similar or almost the same across the layer.

According to one or more embodiments, a light-emitting device may include: a first electrode; a second electrode facing the first electrode; and an interlayer arranged between the first electrode and the second electrode and including an emission layer, and a layer in the interlayer may be prepared by using the ink composition for the light-emitting device. In other words, according to an embodiment, a light-emitting device may include: a first electrode and a second electrode each having a surface opposite the other; and an interlayer arranged between the first electrode and the second electrode and including an emission layer, wherein a layer of the interlayer may be prepared by using the ink composition for the light-emitting device.

In an embodiment, the first electrode may be an anode, and the second electrode may be a cathode, and the interlayer may further include a hole transport region arranged between the first electrode and the emission layer, and/or an electron transport region arranged between the emission layer and the second electrode. The hole transport region may include a hole injection layer, a hole transport layer, an emission auxiliary layer, an electron blocking layer, or any combination thereof, and the electron transport region may include a hole blocking layer, an electron transport layer, an electron injection layer, or any combination thereof.

In an embodiment, a layer of the interlayer may be an electron transport layer, an electron injection layer, a hole injection layer, and/or a hole transport layer.

In an embodiment, a layer of the interlayer may be prepared by a solution process (for example, spin coating, inkjet, etc.).

According to one or more embodiments, an electronic apparatus may include the light-emitting device.

In an embodiment, the electronic apparatus may further include a thin-film transistor, wherein the thin-film transistor may include a source electrode and a drain electrode, and the first electrode of the light-emitting device may be electrically connected to at least one of the source electrode and the drain electrode of the thin-film transistor.

In an embodiment, the electronic apparatus may further include a color filter, a color conversion layer, a touch screen layer, a polarizing layer, or any combination thereof.

The term "interlayer" as utilized herein refers to a single layer and/or all of a plurality of layers arranged between the first electrode and the second electrode of the light-emitting device. FIG. 1 is a schematic cross-sectional view of a light-emitting device 10 according to an embodiment of the disclosure. The light-emitting device 10 includes a first electrode 110, an interlayer 130, and a second electrode 150.

Hereinafter, a structure of the light-emitting device 10 according to an embodiment and a method of manufacturing the light-emitting device 10 will be described in connection with FIG. 1.

First Electrode 110

In FIG. 1, a substrate may be additionally located under the first electrode 110 or above the second electrode 150. In an embodiment, as the substrate, a glass substrate or a plastic substrate may be utilized. In an embodiment, the substrate may be a flexible substrate, and may include plastics with excellent heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material to facilitate injection of holes.

The first electrode 110 may be a reflective electrode, a semi-transmissive electrode, or a transmissive electrode. When the first electrode 110 is a transmissive electrode, the material for forming the first electrode 110 may include indium tin oxide (ITO), indium zinc oxide (IZO), tin oxide ($SnO_2$), zinc oxide (ZnO), or any combination thereof. In an embodiment, when the first electrode 110 is a semi-transmissive electrode or a reflective electrode, the material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a single-layered structure consisting of a single layer, or a multilayer structure including a plurality of layers. In an embodiment, the first electrode 110 may have a three-layered structure of ITO/Ag/ITO.

Interlayer 130

The interlayer 130 is located on the first electrode 110. The interlayer 130 may include an emission layer.

The interlayer 130 may further include a hole transport region located between the first electrode 110 and the emission layer and an electron transport region located between the emission layer and the second electrode 150.

The interlayer 130 may include an emission layer and further include a metal-containing compound such as an organometallic compound, an inorganic material such as a quantum dot, or the like, in addition to various organic materials.

In an embodiment, the interlayer 130 may include, i) two or more emission layers sequentially stacked between the first electrode 110 and the second electrode 150, and ii) a charge generation layer located between the two emission layers. When the interlayer 130 includes the emission layers and the charge generation layer as described above, the light-emitting device 10 may be a tandem light-emitting device.

Hole Transport Region in Interlayer 130

The hole transport region may have: i) a single-layered structure consisting of a single layer consisting of a single material; ii) a single-layered structure consisting of a single layer consisting of a plurality of different materials; or iii) a multilayer structure including a plurality of layers including different materials.

The hole transport region may include a hole injection layer, a hole transport layer, an emission auxiliary layer, an electron blocking layer, or any combination thereof.

The hole injection layer, the hole transport layer, the emission auxiliary layer, and/or the electron blocking layer may be prepared by using the ink composition for the light-emitting device according to an embodiment of the disclosure.

In an embodiment, the hole transport region may have a multilayer structure including a hole injection layer/hole transport layer structure, a hole injection layer/hole transport layer/emission auxiliary layer structure, a hole injection layer/emission auxiliary layer structure, or a hole injection layer/hole transport layer/electron blocking layer structure, the layers of each structure being stacked sequentially stacked from the first electrode 110.

The hole transport region may include a compound represented by Formula 201, a compound represented by Formula 202, or any combination thereof:

Formula 201

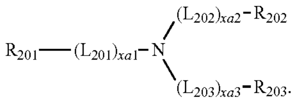

Formula 202

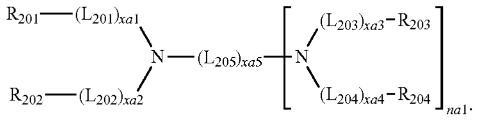

wherein, in Formulae 201 and 202, $L_{201}$ to $L_{204}$ may each independently be a $C_3$-$C_{60}$ carbocyclic group that is unsubstituted or substituted with at least one $R_{10a}$ or a $C_1$-$C_{20}$ heterocyclic group that is unsubstituted or substituted with at least one $R_{10a}$, $L_{205}$ may be *—O—*', *—N($Q_{201}$)-*I, a $C_1$-$C_{20}$ alkylene group that is unsubstituted or substituted with at least one $R_{10a}$, a $C_2$-$C_{20}$ alkenylene group that is unsubstituted or substituted with at least one $R_{10a}$, a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $R_{201}$ and $R_{202}$ may optionally be linked to each other via a single bond, a $C_1$-$C_5$ alkylene group that is unsubstituted or substituted with at least one $R_{10a}$, or a $C_2$-$C_5$ alkenylene group that is unsubstituted or substituted with at least one $R_{10a}$ to form a $C_8$-$C_{60}$ polycyclic group (for example, a carbazole group, etc.) that is unsubstituted or substituted with at least one $R_{10a}$, $R_{203}$ and $R_{204}$ may optionally be linked to each other via a single bond, a $C_1$-$C_5$ alkylene group that is unsubstituted or substituted with at least one $R_{10a}$, or a $C_2$-$C_5$ alkenylene group that is unsubstituted or substituted with at least one $R_{10a}$ to form a $C_8$-$C_{60}$ polycyclic group that is unsubstituted or substituted with at least one $R_{10a}$, and na1 may be an integer from 1 to 4.

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole-transporting characteristics may be obtained without a substantial increase in driving voltage.

The emission auxiliary layer may increase light-emission efficiency by compensating for an optical resonance distance of the wavelength of light emitted by an emission layer, and the electron blocking layer may block the leakage of electrons from an emission layer to a hole transport region. Materials that may be included in the hole transport region may be included in the emission auxiliary layer and the electron blocking layer.

p-Dopant

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

In an embodiment, the lowest unoccupied molecular orbital (LUMO) energy level of the p-dopant may be about −3.5 electron volts (eV) or less.

In an embodiment, the p-dopant may include a quinone derivative, a cyano group-containing compound, a compound including an element EU and an element EL2, or any combination thereof.

Examples of the quinone derivative may include TCNQ, F4-TCNQ, and the like.

Examples of the cyano group-containing compound may include HAT-CN, a compound represented by Formula 221, and the like.

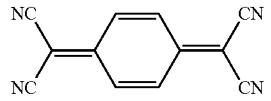

TCNQ

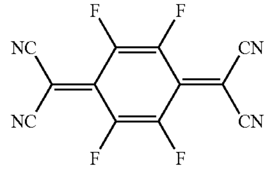

F4-TCNQ

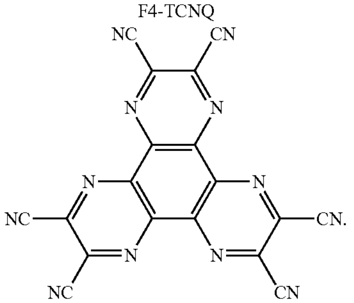

HAT-CN

Formula 221

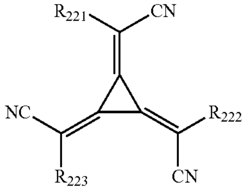

In Formula 221, $R_{221}$ to $R_{223}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, and at least one of $R_{221}$ to $R_{223}$ may each independently be: a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group that is substituted with a cyano group, —F, —Cl, —Br, —I, or any combination thereof; or any combination thereof.

In the compound including the element EL1 and the element EL2, the element EL1 may be a metal, a metalloid, or a combination thereof, and the element EL2 may be a non-metal, a metalloid, or a combination thereof.

Examples of the metal may include an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (i.e., Al (aluminum), Zn (zinc), Ga (gallium), Cd (cadmium), In (indium), Sn (tin), Hg (mercury), TI (thallium), Pb (lead), Bi (bismuth), and Po (polonium), in particular, for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and halogen (for example, F, Cl, Br, I, etc.).

In an embodiment, examples of the compound containing the element EL1 and the element EL2 may include a metal oxide, a metal halide (for example, a metal fluoride, a metal chloride, a metal bromide, or a metal iodide), a metalloid halide (for example, a metalloid fluoride, a metalloid chloride, a metalloid bromide, or a metalloid iodide), a metal telluride, or any combination thereof.

Examples of the metal oxide may include a tungsten oxide (for example, WO, $W_2O_3$, $WO_2$, $WO_3$, $W_2O_5$, etc.), a vanadium oxide (for example, VO, $V_2O_3$, $VO_2$, $V_2O_5$, etc.), a molybdenum oxide (MoO, $Mo_2O_3$, $MoO_2$, $MoO_3$, $Mo_2O_5$, etc.), or a rhenium oxide (for example, $ReO_3$, etc.).

Examples of the metal halide may include an alkali metal halide, an alkaline earth metal halide, a transition metal halide, a post-transition metal halide, and a lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, or CsI.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, or $BaI_2$.

Examples of the transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $Wl_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuC_{12}$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $Ir_{12}$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), or a gold halide (for example, AuF, AuCl, AuBr, AuI, etc.).

Examples of the metal halide may include a zinc halide (for example, $ZnF_2$, $ZnCl_2$, $ZnBr_2$, $ZnI_2$, etc.), an indium halide (for example, $InI_3$, etc.), and a tin halide (for example, $SnI_2$, etc.).

Examples of the lanthanide metal halide may include YbF, $YbF_2$, $YbF_3$, Sm $F_3$, YbCl, $YbCl_2$, $YbCl_3$, $SmCl_3$, YbBr, $YbBr_2$, $YbBr_3$, $SmBr_3$, YbI, $YbI_2$, $YbI_3$, or $SmI_3$.

Examples of the metalloid halide may include an antimony halide (for example, $SbCl_5$, etc.).

Examples of the metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), or a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

When the light-emitting device 10 is a full-color light-emitting device, the emission layer may be patterned into a red emission layer, a green emission layer, and/or a blue emission layer, according to a sub-pixel. In an embodiment, the emission layer may have a stacked structure of two or more layers of a red emission layer, a green emission layer, or a blue emission layer, in which the two or more layers may contact each other or may be separated by at least one layer from each other. In an embodiment, the emission layer may include two or more materials of a red light-emitting material, a green light-emitting material, or a blue light-emitting material, in which the two or more materials may be mixed with each other in a single layer to emit white light.

The emission layer may include a host and a dopant. The dopant may include a phosphorescent dopant, a fluorescent dopant, a delayed fluorescence material, or any combination thereof.

An amount of the dopant in the emission layer may be about 0.01 wt % to about 15 wt % based on 100 wt % of the host material.

In an embodiment, the emission layer may include a quantum dot.

In an embodiment, the emission layer may include a delayed fluorescence material. The delayed fluorescence material may act as a host material or as a dopant in the emission layer.

A thickness of the emission layer may be in a range of about 100 Å to about 1,000 Å, for example, about 200 Å to about 600 Å. When the thickness of the emission layer is within the range, excellent light-emission characteristics may be obtained without a substantial increase in driving voltage.

Quantum Dot

The emission layer may include a quantum dot.

In the present specification, a quantum dot refers to a crystal of a semiconductor compound, and may include any material capable of emitting light of various emission wavelengths according to the size of the crystal.

A diameter of the quantum dot may be, for example, in a range of about 1 nanometer (nm) to about 10 nm.

The quantum dot may be synthesized by a wet chemical process, a metal organic chemical vapor deposition process, a molecular beam epitaxy process, or any process similar thereto.

According to the wet chemical process, a precursor material is mixed with an organic solvent to grow a quantum dot particle crystal. As the crystal grows, the organic solvent naturally acts as a dispersant coordinated on the surface of the quantum dot crystal and controls or regulates the growth of the crystal so that the growth of quantum dot particles may be controlled through a process that is more easily performed than vapor deposition methods such as metal organic chemical vapor deposition (MOCVD) or molecular beam epitaxy (MBE). Moreover, the solution crystallization is a much more cost effective process than vapor deposition processes.

The quantum dot may include: a Group II-VI semiconductor compound; a Group III-V semiconductor compound; a Group III-VI semiconductor compound; a Group semiconductor compound; a Group IV-VI semiconductor compound; a Group IV element or compound; or any combination thereof.

Examples of the Group II-VI semiconductor compound may include: a binary compound, such as CdS, CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the Group III-V semiconductor compound may include: a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. In an embodiment, the Group III-V semiconductor compound may further include Group II elements. Examples of the Group III-V semiconductor compound further including Group II elements may include InZnP, InGaZnP, InAlZnP, and the like.

Examples of the Group III-VI semiconductor compound may include: a binary compound, such GaS, GaSe, $Ga_2Se_3$, GaTe, InS, InSe, $In_2S_3$, $In_2Se_3$, or InTe; a ternary compound, such as $InGaS_3$, or $InGaSe_3$; or any combination thereof.

Examples of the Group semiconductor compound may include: a ternary compound, such as AgInS, $AgInS_2$, CuInS, $CuInS_2$, $CuGaO_2$, $AgGaO_2$, or $AgAlO_2$; or any combination thereof.

Examples of the Group IV-VI semiconductor compound may include: a binary compound, such as SnS, SnSe, SnTe, PbS, PbSe, PbTe, or the like; a ternary compound, such as SnSeS, SnSeTe, SnSTe, PbSeS, PbSeTe, PbSTe, SnPbS, SnPbSe, SnPbTe, or the like; a quaternary compound, such as SnPbSSe, SnPbSeTe, SnPbSTe, or the like; or any combination thereof.

The Group IV element or compound may include: a single element compound, such as Si or Ge; a binary compound, such as SiC or SiGe; or any combination thereof.

Each element included in a multi-element compound such as the binary compound, ternary compound, and quaternary compound, may exist in a particle with a uniform concentration or non-uniform concentration.

In an embodiment, the quantum dot may have a single structure or a dual core-shell structure. In the case of the quantum dot having a single structure, the concentration of each element included in the corresponding quantum dot may be uniform. In an embodiment, the material contained in the core and the material contained in the shell may be different from each other.

The shell of the quantum dot may act as a protective layer to prevent chemical degeneration of the core to maintain semiconductor characteristics and/or as a charging layer to impart electrophoretic characteristics to the quantum dot. The shell may be a single layer or a multi-layer. The element presented in the interface between the core and the shell of the quantum dot may have a concentration gradient that decreases toward the center of the quantum dot.

Examples of the material forming the shell of the quantum dot may include an oxide of metal, metalloid, or non-metal, a semiconductor compound, or any combination thereof. Examples of the oxide of metal, metalloid, or non-metal may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; or any combination thereof. Examples of the semiconductor compound may include, as described herein, a Group II-VI semiconductor compound, a Group III-V semiconductor compound, a Group III-VI semiconductor compound, a Group I-III-VI semiconductor compound, a Group IV-VI semiconductor compound, or any combination thereof. In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be about 45 nm or less, for example, about 40 nm or less, for example, about 30 nm or less, and within these ranges, color purity or color reproducibility may be increased. In addition, because the light emitted through the quantum dot is emitted in all directions, the wide viewing angle may be improved.

In addition, the quantum dot may be a spherical particle, a pyramidal particle, a multi-arm particle, a cubic nanoparticle, a nanotube particle, a nanowire particle, a nanofiber particle, or a nanoplate particle.

Because the energy band gap may be adjusted by controlling the size of the quantum dot, light having various wavelength bands may be obtained from the quantum dot emission layer. Therefore, by utilizing quantum dots of different sizes, a light-emitting device that emits light of various wavelengths may be implemented. In an embodiment, the size of the quantum dot may be selected to emit red, green and/or blue light. In addition, a combination of different sizes of the quantum dots may be configured to emit white light by combining emitted light of various colors.

Electron Transport Region in Interlayer 130

The electron transport region may have: i) a single-layered structure consisting of a single layer consisting of a single material, ii) a single-layered structure consisting of a single layer consisting of a plurality of different materials, or iii) a multi-layered structure including a plurality of layers including the same or different materials.

The electron transport region may include a hole blocking layer, an electron transport layer, an electron injection layer, or any combination thereof.

The hole blocking layer, the electron transport layer, and/or the electron injection layer may be prepared by using the ink composition described herein for the light-emitting device according to an embodiment of the disclosure.

In an embodiment, the electron transport region may have a structure including an electron transport layer/electron injection layer structure or a hole blocking layer/electron transport layer/electron injection layer structure, the layers of each structure being stacked sequentially stacked from the emission layer.

The electron transport region (for example, a hole blocking layer or an electron transport layer in the electron transport region) may include a metal-free compound including at least one π electron-deficient nitrogen-containing $C_1$-$C_{60}$ cyclic group.

In an embodiment, the electron transport region may include a compound represented by Formula 601:

$$[Ar_{601}]_{xe11}\text{-}[(L_{601})_{xe1}\text{-}R_{601}]_{xe21} \qquad \text{Formula 601}$$

wherein, in Formula 601, $Ar_{601}$ and $L_{601}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each independently be the same as described in connection with xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group that is unsubstituted or substituted with at least one $R_{10a}$.

In an embodiment, when xe11 in Formula 601 is 2 or more, two or more $Ar_{601}$(s) may be linked to each other via a single bond.

In an embodiment, $Ar_{601}$ in Formula 601 may be a substituted or unsubstituted anthracene group.

In an embodiment, the electron transport region may include a compound represented by Formula 601-1:

Formula 601-1

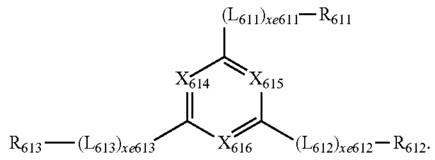

wherein, in Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each independently be the same as described in connection with $L_{601}$, xe611 to xe613 may each independently be the same as described in connection with xe17

$R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$.

In an embodiment, xe1 and xe611 to xe613 in Formulae 601 and 601-1 may each independently be 0, 1, or 2.

A thickness of the electron transport region may be about 100 Å to about 5,000 Å, for example, about 160 Å to about 4,000 Å. When the electron transport region includes a hole blocking layer, an electron transport layer, or any combination thereof, a thickness of the hole blocking layer or the electron transport layer may each independently be in a range of about 20 Å to about 1,000 Å, for example, about 30 Å to about 300 Å, and a thickness of the electron transport layer may be in a range of about 100 Å to about 1,000 Å, for example, about 150 Å to about 500 Å. When the thicknesses of the hole blocking layer and/or the electron transport layer are within these ranges described above, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. In an embodiment, the metal-containing material may be a Li-based or Ca-based compound. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or ET-D2:

ET-D1

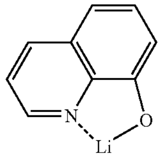

ET-D2

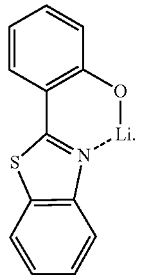

ET-D2

The electron transport region may include an electron injection layer to facilitate the injection of electrons from the second electrode 150. The electron injection layer may be in direct contact with the second electrode 150.

The electron injection layer may have: i) a single-layered structure consisting of a single layer consisting of a single material, ii) a single-layered structure consisting of a single layer consisting of a plurality of different materials, or iii) a multilayer structure including a plurality of layers including the same or different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides, halides (for example, fluorides, chlorides, bromides, or iodides), or tellurides of the alkali metal, the alkaline earth metal, and the rare earth metal, or any combination thereof.

The alkali metal-containing compound may include alkali metal oxides, such as $Li_2O$, $Cs_2O$, or $K_2O$, alkali metal halides, such as LiF, NaF, CsF, KF, LiI, NaI, CsI, or KI, or any combination thereof. The alkaline earth metal-containing compound may include an alkaline earth metal compound, such as BaO, SrO, CaO, $Ba_xSr_{1-x}O$ (x is a real number satisfying the condition of $0<x<1$), $Ba_xCa_{1-x}O$ (x is a real number satisfying the condition of $0<x<1$), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of an ion of the alkali metal, the alkaline earth metal, and the rare earth metal and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer may further include an organic material (for example, a compound represented by Formula 601).

In an embodiment, the electron injection layer may consist of i) an alkali metal-containing compound (for example, an alkali metal halide), ii) a) an alkali metal-containing compound (for example, an alkali metal halide); and b) an alkali metal, an alkaline earth metal, a rare earth metal, or any combination thereof. In an embodiment, the electron injection layer may be a KI:Yb co-deposited layer, a RbI:Yb co-deposited layer, or the like.

When the electron injection layer further includes an organic material, the alkali metal, alkaline earth metal, rare earth metal, alkali metal-containing compound, alkaline earth metal-containing compound, rare earth metal-containing compound, alkali metal complex, alkaline earth-metal complex, rare earth metal complex, or any combination thereof may be homogeneously or non-homogeneously dispersed in a matrix including the organic material.

A thickness of the electron injection layer may be in a range of about 1 Å to about 100 Å, and, for example, about 3 Å to about 90 Å. When the thickness of the electron injection layer is within the range described above, satisfactory electron injection characteristics may be obtained without a substantial increase in driving voltage.

Second Electrode 150

The second electrode 150 may be located on the interlayer 130 having such a structure. The second electrode 150 may be a cathode, which is an electron injection electrode, and as the material for the second electrode 150, a metal, an alloy, an electrically conductive compound, or any combination thereof, each having a low work function, may be utilized.

In an embodiment, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multilayer structure including two or more layers.

Capping Layer

A first capping layer may be located outside the first electrode 110, and/or a second capping layer may be located outside the second electrode 150. In detail, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in an emission layer of the interlayer 130 of the light-emitting device 10 may be extracted toward the outside through the first electrode 110, which is a semi-transmissive electrode or a transmissive electrode, and the first capping layer or light generated in an emission layer of the interlayer 130 of the light-emitting device 10 may be extracted toward the outside through the second electrode 150, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 is increased, so that the luminescence efficiency of the light-emitting device 10 may be improved.

Each of the first capping layer and second capping layer may include a material having a refractive index (at 589 nm) of 1.6 or more.

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one of the first capping layer and the second capping layer may each independently include an amine group-containing compound.

In an embodiment, at least one of the first capping layer and the second capping layer may each independently include a compound represented by Formula 201, a compound represented by Formula 202, or any combination thereof.

In an embodiment, at least one of the first capping layer and the second capping layer may each independently be one of Compounds CP1 to CP6, β-NPB, or any compound:

CP1

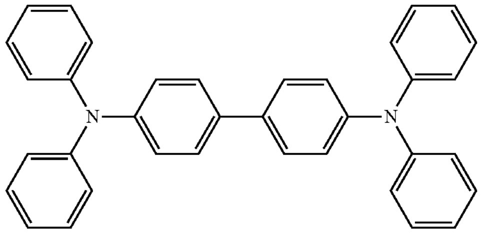

-continued

CP2

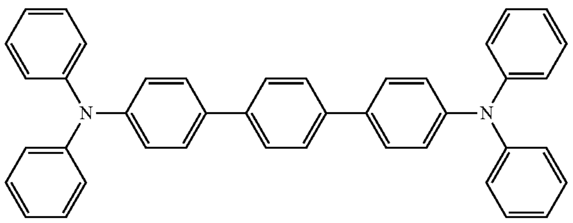

CP3

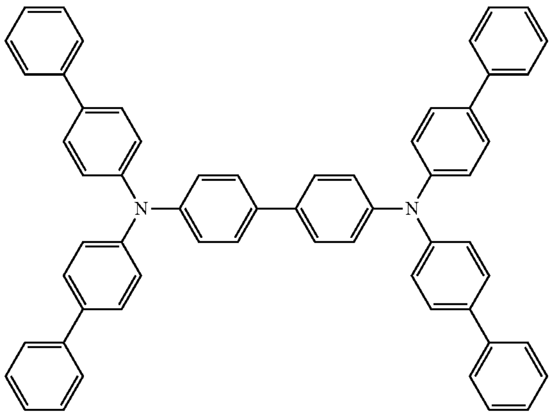

CP4

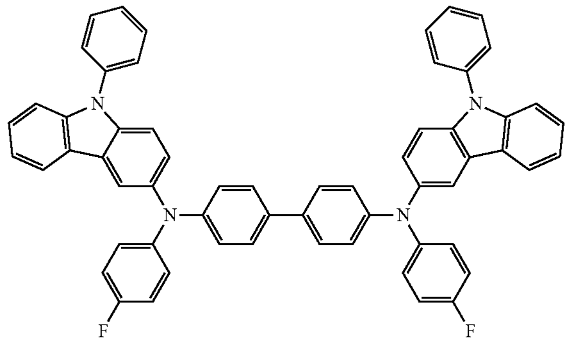

CP5

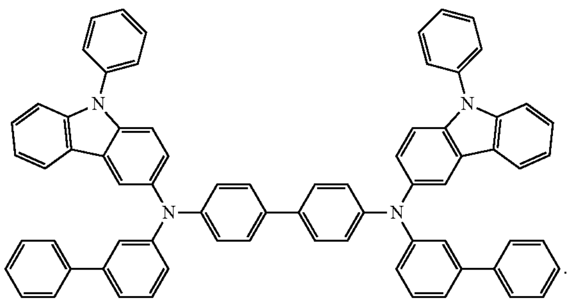

-continued

CP6

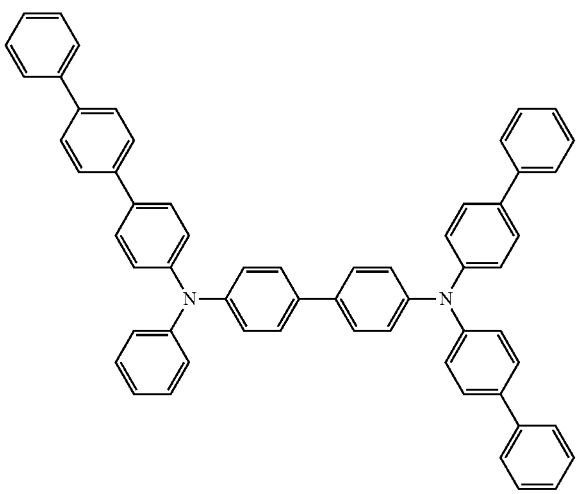

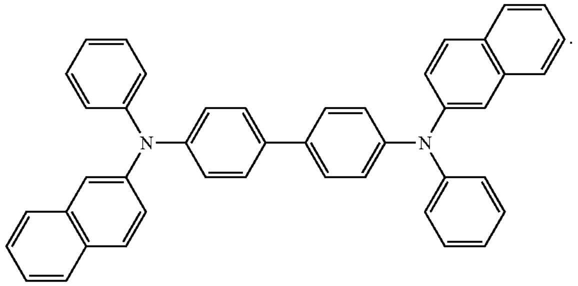

β-NPB

Electronic Apparatus

The light-emitting device may be included in various electronic apparatuses. In an embodiment, the electronic apparatus including the light-emitting device may be a light-emitting apparatus, an authentication apparatus, or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. In an embodiment, the light emitted from the light-emitting device may be blue light. The light-emitting device may be the same as described above. In an embodiment, the color conversion layer may include quantum dots. The quantum dot may be, for example, a quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining layer may be located among the subpixel areas to define each of the subpixel areas.

The color filter may further include a plurality of color filter areas and light-shielding patterns located among the color filter areas, and the color conversion layer may include a plurality of color conversion areas and light-shielding patterns located among the color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths from one another. In an embodiment, the first color light may be red light, the second color light may be green light, and the third color light may be blue light. In an embodiment, the color filter areas (or the color conversion areas) may include quantum dots. In detail, the first area may include a red quantum dot, the second area may include a green quantum dot, and the third area may not include a quantum dot. The quantum dot may be the same as described in the present specification. The first area, the second area, and/or the third area may each further include a scatterer.

In an embodiment, the light-emitting device may emit a first light, the first area may absorb the first light to emit a first first-color light, the second area may absorb the first light to emit a second first-color light, and the third area may absorb the first light to emit a third first-color light. In this regard, the first first-color light, the second first-color light, and the third first-color light may each have different maximum emission wavelengths. In detail, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an activation layer, wherein any one of the source electrode and the drain electrode may be electrically connected to any one of the first electrode and the second electrode of the light-emitting device.

The thin-film transistor may further include a gate electrode, a gate insulating film, etc.

The activation layer may include crystalline silicon, amorphous silicon, organic semiconductor, oxide semiconductor, or the like.

The electronic apparatus may further include a sealing portion for sealing the light-emitting device. The sealing portion and/or the color conversion layer may be located between the color filter and the light-emitting device. The sealing portion allows light from the light-emitting device to be extracted to the outside, while simultaneously preventing ambient air and moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. When the sealing portion is a thin film encapsulation layer, the electronic apparatus may be flexible.

Various functional layers may be additionally located on the sealing portion, in addition to the color filter and/or the color conversion layer, according to the intended use of the electronic apparatus. The functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus that authenticates an individual by utilizing biometric information of a living body (for example, fingertips, pupils, etc.).

The authentication apparatus may further include, in addition to the light-emitting device, a biometric information collector.

The electronic apparatus may be applied to various displays, light sources, lighting, personal computers (for example, a mobile personal computer), mobile phones, digital cameras, electronic diaries, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
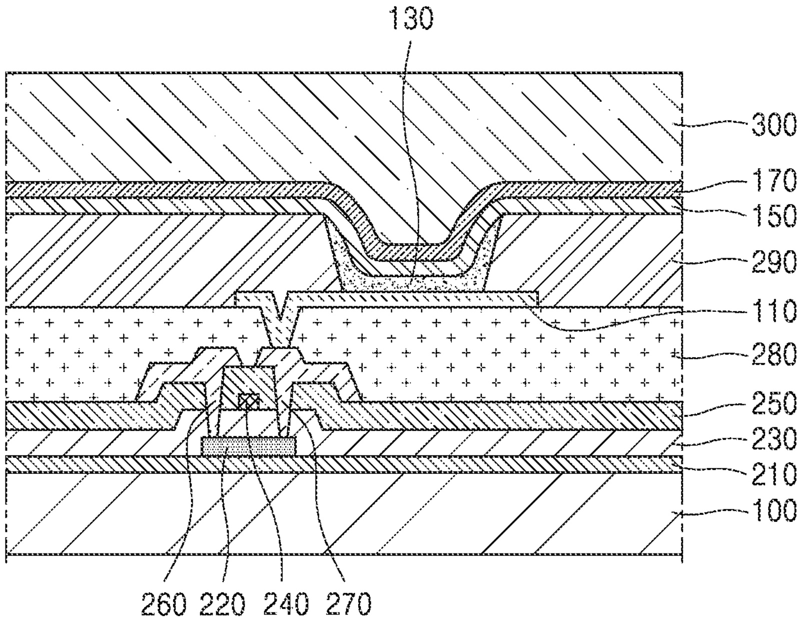
FIG. 2 is a cross-sectional view of a light-emitting apparatus according to an embodiment of the disclosure.

FIG. 2 is a cross-sectional view of an electronic apparatus according to an embodiment of the disclosure. The electronic apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be formed on the substrate 100. The buffer layer 210 may prevent penetration of impurities through the substrate 100 and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor such as silicon or polysilicon, an organic semiconductor, or an oxide semiconductor, and may include a source region, a drain region, and a channel region.

A gate insulating film 230 for insulating the activation layer 220 from the gate electrode 240 may be located on the activation layer 220, and the gate electrode 240 may be located on the gate insulating film 230.

An insulating film 250 is located on the gate electrode 240. The insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the insulating film 250. The insulating film 250 and the gate insulating film 230 may be formed to expose the source region and the drain region of the activation layer 220, and the source electrode 260 and the drain electrode 270 may be in contact with the exposed portions of the source region and the drain region of the activation layer 220.

The TFT is electrically connected to a light-emitting device to drive the light-emitting device and is covered by a passivation layer 280. The passivation layer 280 may include an inorganic insulating film, an organic insulating film, or a combination thereof. A light-emitting device is provided on the passivation layer 280. The light-emitting device may include a first electrode 110, an interlayer 130, and a second electrode 150.

The first electrode 110 may be formed on the passivation layer 280. The passivation layer 280 does not completely cover the drain electrode 270 and exposes a portion of the drain electrode 270, and the first electrode 110 is connected to the exposed portion of the drain electrode 270.

A pixel-defining layer 290 containing an insulating material may be located on the first electrode 110. The pixel-defining layer 290 exposes a region of the first electrode 110, and an interlayer 130 may be formed in the exposed region of the first electrode 110. The pixel-defining layer 290 may be a polyimide or polyacrylic organic film. Although not shown in FIG. 2, at least some layers of the interlayer 130 may extend beyond the upper portion of the pixel-defining layer 290 to be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, or the like), an epoxy-based resin (for example, aliphatic glycidyl ether (AGE), or the like), or a combination thereof; or a combination of the inorganic film and the organic film.

Figure 3:
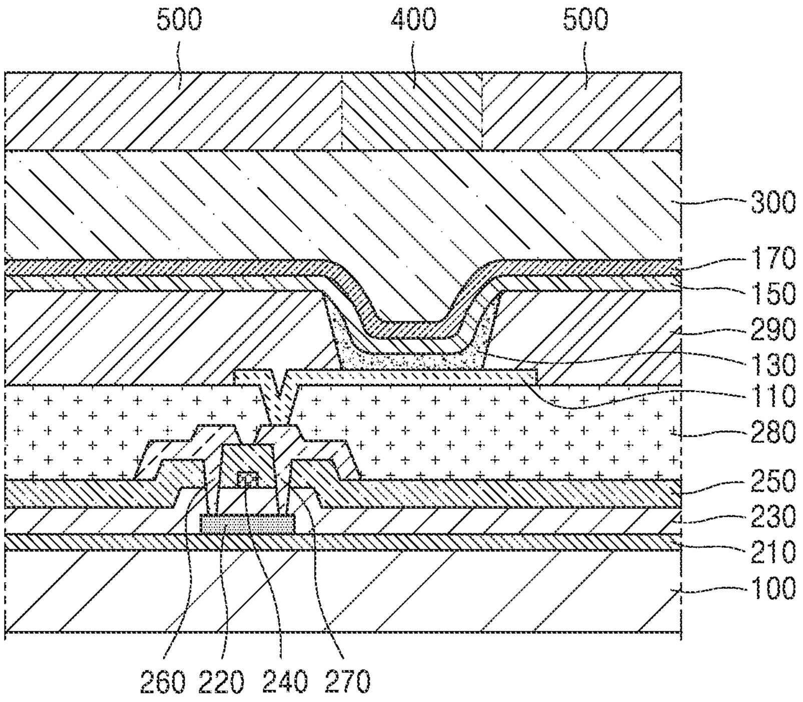
FIG. 3 is a cross-sectional view of a light-emitting apparatus according to another embodiment of the disclosure.

FIG. 3 is a cross-sectional view of an electronic apparatus according to another embodiment of the disclosure. The electronic apparatus of FIG. 3 is the same as the electronic apparatus of FIG. 2, except that a light-shielding pattern 500 and a functional region 400 are additionally arranged on the encapsulation portion 300. The functional region 400 may be a combination of i) a color filter area, ii) a color conversion area, or iii) a combination of the color filter area and the color conversion area. In an embodiment, the light-emitting device included in the electronic apparatus of FIG. 3 may be a tandem light-emitting device.

Manufacture Method

Respective layers included in the hole transport region, the emission layer, and respective layers included in the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by spin coating, the spin coating may be performed at a coating speed of about 2,000 rpm to about 5,000 rpm and at a heat treatment temperature of about 80° C. to about 200° C. by taking into account a material to be included in a layer to be formed and the structure of a layer to be formed.

Definition of Terms

The term "$C_3$-$C_{60}$ carbocyclic group" as used herein refers to a cyclic group consisting of carbon only as a ring-forming atom and having three to sixty carbon atoms, and the term "$C_1$-$C_{60}$ heterocyclic group" as used herein refers to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. In an embodiment, the $C_1$-$C_{60}$ heterocyclic group has 3 to 61 ring-forming atoms.

The term "cyclic group" as utilized herein may include the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

In an embodiment, the $C_3$-$C_{60}$ carbocyclic group may be i) a group T1 or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a group T2, ii) a condensed cyclic group in which two or more groups T2 are condensed with each other, or iii) a condensed cyclic group in which at least one group T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) a group T1, ii) a condensed cyclic group in which two or more groups T1 are condensed with each other, iii) a group T3, iv) a condensed cyclic group in which two or more groups T3 are condensed with each other, or v) a condensed cyclic group in which at least one group T3 and at least one group T1 are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), and the π electron-deficient nitrogen-containing $C_1$-$C_{60}$ cyclic group may be i) a group T4, ii) a condensed cyclic group in which two or more group T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), wherein the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein refers to a group condensed to any cyclic group or a polyvalent group (for example, a divalent group, a trivalent group, a tetravalent group, etc.), depending on the structure of a formula in connection with which the terms are used. In an embodiment, "a benzene group" may be a benzo group, a phenyl group, a phenylene group, or the like, which may be easily understood by one of ordinary skill in the art according to the structure of a formula including the "benzene group."

In an embodiment, examples of a monovalent $C_3$-$C_{60}$ carbocyclic group and a monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of a divalent $C_3$-$C_{60}$ carbocyclic group and a divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" used herein refers to a monovalent cyclic group that has three to ten carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having six to sixty carbon atoms, and the term "$C_6$-$C_{60}$ arylene group" as used herein refers to a divalent group having a carbocyclic aromatic system having six to sixty carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as used herein refers to a monovalent group having two or more rings condensed to each other, only carbon atoms (for example, having 8 to 60 carbon atoms) as ring-forming atoms, and non-aromaticity in its molecular structure when considered as a whole. Examples of the monovalent non-aromatic condensed polycyclic group include an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group having two or more rings condensed to each other, at least one heteroatom other than carbon atoms (for example, having 1 to 60 carbon atoms), as a ring-forming atom, and non-aromaticity in its molecular structure when considered as a whole. Examples of the monovalent non-aromatic condensed heteropolycyclic group include a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having the same structure as a monovalent non-aromatic condensed heteropolycyclic group.

The term "$C_6$-$C_{60}$ aryloxy group" as used herein indicates $-OA_{102}$ (wherein $A_{102}$ is the $C_6$-$C_{60}$ aryl group), and the term "$C_6$-$C_{60}$ arylthio group" as used herein indicates $-SA_{103}$ (wherein $A_{103}$ is the $C_6$-$C_{60}$ aryl group).

The term "$C_7$-$C_{60}$ aryl alkyl group" used herein refers to $-A_{104}A_{105}$ (where $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" used herein refers to $-A_{106}A_{107}$ (where $A_{106}$ may be a $C_1$-$C_{59}$ alkylene group, and $A_{107}$ may be a $C_1$-$C_{59}$ heteroaryl group).

$R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, $-Si(Q_{11})(Q_{12})(Q_{13})$, $-N(Q_{11})(Q_{12})$, $-B(Q_{11})(Q_{12})$, $-C(=O)(Q_{11})$, $-S(=O)_2(Q_{11})$, $-P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, $-Si(Q_{21})(Q_{22})(Q_{23})$, $-N(Q_{21})(Q_{22})$, $-B(Q_{21})(Q_{22})$, $-C(=O)(Q_{21})$, $-S(=O)_2(Q_{21})$, $-P(=O)(Q_{21})(Q_{22})$, or any combination thereof; or $-Si(Q_{31})(Q_{32})(Q_{33})$, $-N(Q_{31})(Q_{32})$, $-B(Q_{31})(Q_{32})$, $-C(=O)(Q_{31})$, $-S(=O)_2(Q_{31})$, or $-P(=O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ aryl alkyl group, or a $C_2$-$C_{60}$ heteroaryl alkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "hetero atom" as used herein refers to any atom other than a carbon atom. Examples of the heteroatom include O, S, N, P, Si, B, Ge, Se, or any combination thereof.

The term "the third-row transition metal" as used herein includes hafnium (Hf), tantalum (Ta), tungsten (W), rhenium (Re), osmium (Os), iridium (Ir), platinum (Pt), gold (Au), or the like.

The term "Ph" as used herein refers to a phenyl group, the term "Me" as used herein refers to a methyl group, the term "Et" as used herein refers to an ethyl group, the term "ter-Bu" or "But" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". The "terphenyl group" is a substituted phenyl group having, as a substituent, a $C_6$-$C_{60}$ aryl group substituted with a $C_6$-$C_{60}$ aryl group.

The maximum number of carbon atoms in the substituent definition is exemplary. In an embodiment, the number 60 as the maximum number of carbon atoms in a $C_1$-$C_{60}$ alkyl group is exemplary, and the definition of an alkyl group is also equally applied to a $C_1$-$C_{20}$ alkyl group. The other cases are the same.

* and *' as used herein, unless defined otherwise, each refer to a binding site to a neighboring atom in a corresponding formula.

Hereinafter, a compound and light-emitting device according to an embodiment of the disclosure will be described in more detail with reference to the following Examples.

EXAMPLES

Preparation of Ink Compositions

An ink composition for a light-emitting device was prepared by utilizing ZnMgO (12 nm, concentration: 5 wt %) and the solvent composition in Table 1.

TABLE 1

| | First Solvent | | | Second Solvent | | | Third Solvent | | | Viscosity of mixed solvent |
|---|---|---|---|---|---|---|---|---|---|---|
| | Comp | BP (° C.) | η (cP) | Comp | BP | η (cP) | Comp | BP (° C.) | η (cP) | [second solvent + third solvent] (cP) |
| Example 1 (50/40/10)[1] | 1-1 | 208 | 4.0 | 2-1 | 272 | 8 | 3-1 | 290 | 980 | 60 |
| Example 2 (65/5/30) | 1-2 | 248 | 5.0 | 2-2 | 271 | 7 | 3-2 | 296 | 110 | 100 |
| Example 3 (75/10/15) | 1-3 | 189 | 4.5 | 2-3 | 290 | 10 | 3-3 | 270—350 | 141 | 20 |
| Example 4 (75/3/22) | 1-4 | 244 | 4.5 | 2-4 | 272 | 6 | 3-1 | 290 | 980 | 900 |
| Example 5 (50/25/25) | 1-5 | 256 | 7.5 | 2-5 | 295 | 12 | 3-4 | 327 | 61.9 | 20 |
| Comp. Example 1 (50/50/0) | 1-1 | 208 | 4.0 | 2-2 | 271 | 7 | none | — | — | 6.0 |
| Comp. Example 2 (50/50/0) | 1-1 | 208 | 4.0 | 2-2 | 271 | 7 | none | — | — | 6.0 |
| Comp. Example 3 (65/35/0) | 1-2 | 248 | 5.0 | 2-1 | 270 | 8 | none | — | — | 6.0 |
| Comp. Example 4 (75/25/0) | 1-4 | 244 | 4.5 | 2-3 | 290 | 10 | none | — | — | 11 |
| Comp. Example 5 (40/30/30) | 1-2 | 248 | 5.0 | 2-1 | 270 | 8 | 3-1 | 290 | 980 | 60 |
| Comp. Example 6 (25/35/40) | 1-4 | 244 | 4.5 | 2-3 | 290 | 10 | 3-3 | 270—350 | 141 | 20 |

[1]The respective volume fraction of first solvent, second solvent, and third solvent (solvent composition) in terms of total volume of the Example solvent composition is provided in parentheses.

The viscosity (η) in Table 1 is a value measured at 25° C. and reported in centipoise.

BP refers to boiling point.

Compound 1-1: Ethylene glycol monohexyl ether

Compound 1-2: Diethylene glycol monopentyl ether

Compound 1-3: Dipropylene glycol monomethyl ether

Compound 1-4: Propylene glycol mono 2-ethylhexyl ether

Compound 1-5: Triethylene glycol monoethyl ether

Compound 2-1: Diethylene glycol 2-ethylpentyl ether

Compound 2-2: Dipropylene glycol heptyl ether

Compound 2-3: Triethylene glycol 1-ethylbutyl ether

Compound 2-4: Diethylene glycol 1-ethylbutyl ether

Compound 2-5: Triethylene glycol monooctyl ether

Compound 3-1: Glycerin

Compound 3-2: Sorbitol

Compound 3-3: Polyethylene glycol (molecular weight: 800)

Compound 3-4: Tetraethylene glycol

Measurement of Viscosity of Ink Composition

The initial viscosities and viscosities at a 75% dry time point of the ink compositions of Examples and Comparative Examples were measured, and the results are reported in Table 2.

TABLE 2

| | Initial viscosity (cP) | Viscosity (cP)[1) ] at a 75% dry time point |
|---|---|---|
| Example 1 | 8.0 | 250 |
| Example 2 | 8.0 | 80 |
| Example 3 | 5.5 | 25 |
| Example 4 | 10.0 | 950 |
| Example 5 | 9.0 | 30 |
| Comp. Example 1 | 5.0 | 6.0 |
| Comp. Example 2 | 5.0 | 6.0 |
| Comp. Example 3 | 5.5 | 6.0 |
| Comp. Example 4 | 6.5 | 10.0 |
| Comp. Example 5 | 20 | 250 |
| Comp. Example 6 | 16 | 30 |

The viscosity in Table 2 is a value measured at 25° C.

[1)]Each ink composition was vacuum-dried in a vacuum oven at a pressure of 0.1 Torr, and the ink was collected when 75% of the volume evaporated to measure the viscosity.

Ink Drop Evaluation and Thickness Profile Measurement of Ink Composition

The ink compositions of Examples and Comparative Examples were jetted from a Dimatix DMP-2800 printer, followed by ink drop evaluation, and the results are reported in Table 3.

The ink drop evaluation was evaluated by measuring a distance (D1) between two drops when a second drop was jetted at the same position after 10 minutes after initial drop jetting.

When D1 is within 10 μm, it may be said to be acceptable or excellent, and when D1 is greater than 10 μm, it may be said to be unacceptable or defective.

Figure 4:
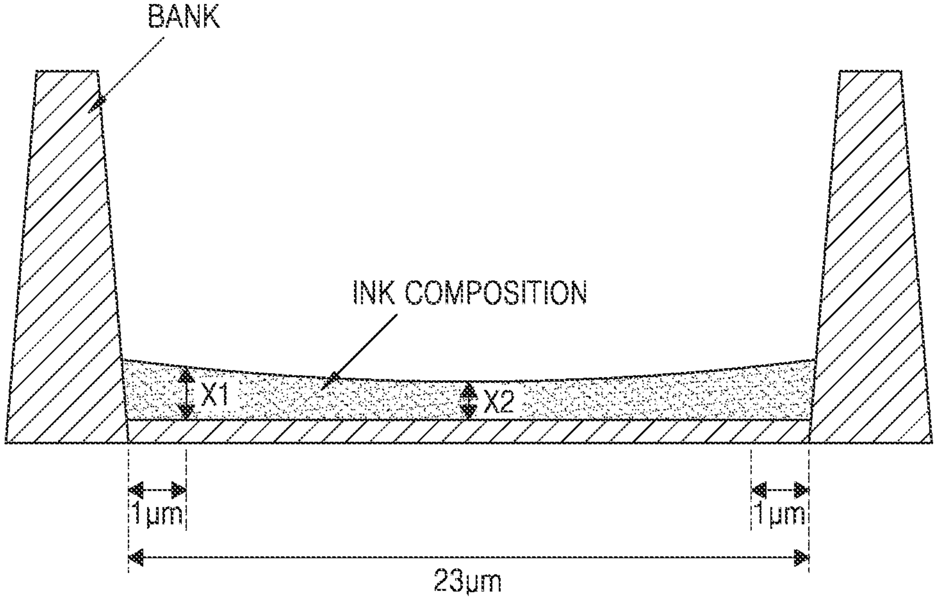
FIG. 4 is a diagram showing a thickness profile of an ink composition for a light-emitting device, the ink composition being applied in a bank.

The thickness profile was measured as follows (see FIG. 4).

A bank having the upper portion provided with liquid repellency by utilizing a polyacrylate polyimide copolymer was prepared to have a width/length/height of 25 μm/85 μm/1.2 μm. The average volume of the back was measured to be 2.5 picoliters (pL). A drop amount of each ink composition was set to 10 pL so that the volume of the back was about 25%.

In order to confirm a coffee ring improvement effect, the thickness of 1 μm portion of the edge of the bank in the short axis direction (23 μm) was set to X1, the thickness of the center was set to X2, and the coffee ring improvement effect was verified with the value of X2/X1.

TABLE 3

| | D1 | X2/X1 |
|---|---|---|
| Example 1 | 3 | 0.98 |
| Example 2 | 3 | 0.94 |
| Example 3 | 2 | 0.88 |
| Example 4 | 4 | 0.98 |
| Example 5 | 3 | 0.89 |
| Comp. Example 1 | 2 | 0.12 |
| Comp. Example 2 | 2 | 0.08 |
| Comp. Example 3 | 2 | 0.15 |
| Comp. Example 4 | 3 | 0.25 |
| Comp. Example 5 | 16 | 0.98 |
| Comp. Example 6 | 12 | 0.90 |

Referring to Tables 2 and 3, it was confirmed that Comparative Examples 1 to 4 including only the first solvent and the second solvent had low viscosities at the 75% dry time point, and thus had poor thickness profiles.

Moreover, it was confirmed that Comparative Examples 5 and 6, in which the composition ratio of the first solvent did not reach 50%, had high viscosities at the 75% dry time point, and thus had excellent thickness profile values, but had initial viscosities greater than 12 cP resulting in poor ink drop.

In the case of Examples 1 to 5, the initial viscosities were less than or equal to 12 cP, and therefore, no problem in jetting, and the ink drop evaluation was also excellent. In addition, it was confirmed that the viscosities at the 75% dry time point were relatively high, and thus, the thickness profile values were excellent.

Manufacture of Light-Emitting Device

Example 6

A pixel-defining layer (PDL) was formed on a substrate including a thin-film transistor and ITO 1,200 Å (anode). HT1 was vacuum-deposited on an active subpixel including a light-emitting device to form a hole transport layer having a thickness of 1,300 Å. Next, ZnS was coated on the hole transport layer by inkjet to form an emission layer having a thickness of 200 Å.

The ink composition of Example 1 was applied on the emission layer by inkjet to form an electron transport layer consisting of ZnMgO and having a thickness of 700 Å. Next, Al was vacuum-deposited thereon to form a cathode having a thickness of 100 Å.

The equipment used for deposition was a Sunicel plus 200 evaporator of Sunic System.

HT1

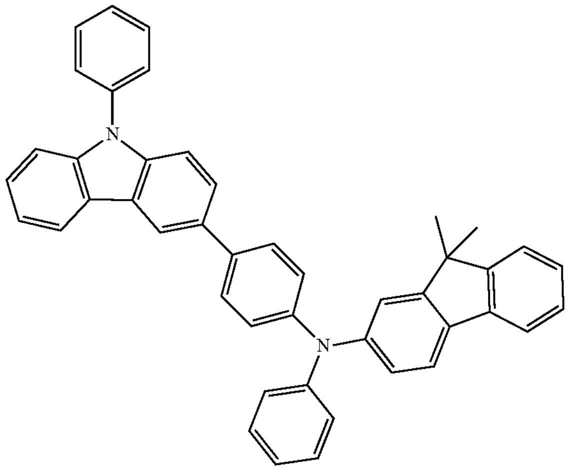

Comparative Example 7

A light-emitting device was manufactured in the same manner as in Example 6, except that the ink composition of Comparative Example 1 was used to form the electron transport layer on the emission layer.

Comparative Example 8

A light-emitting device was manufactured in the same manner as in Example 6, except that the ink composition of Comparative Example 5 was used to form the electron transport layer on the emission layer.

Driving voltage, efficiency, and color purity of the organic light-emitting devices manufactured in Example 6 and Comparative Examples 7 and 8 were measured by utilizing the following method, and the results are shown in Table 4.

Efficiency and lifespan: Power was supplied from a current-voltmeter (Keithley SMU 236), and efficiency was measured using a luminance meter PR650.

TABLE 4

| | Driving voltage (volts) | Efficiency (cd/A) | Lifespan (%) |
|---|---|---|---|
| Example 6 | 4.8 | 4.5 | 130 |
| Comp. Example 7 | 5.7 | 3.3 | 100 |
| Comp. Example 8 | 6.3 | 2.5 | 70 |

From Table 4, it was confirmed that the light-emitting device of Example 6 showed better results than Comparative Examples 7 and 8. In the case of Comparative Example 8, the electron transport layer was not formed normally due to poor degree of ink drop precision, and Comparative Example 7 showed poor results because the thickness profile of the electron transport layer was not good.

When a layer of a light-emitting device is formed by utilizing the ink composition for a light-emitting device according to an embodiment, the thickness profile is improved, and the light-emitting device has excellent efficiency and lifespan by using the ink composition for a light-emitting device as compared to light-emitting devices of the related art.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An ink composition for a light-emitting device, the ink composition comprising:

a metal oxide; and a mixed solvent composition comprising a first solvent, a second solvent, and a third solvent, wherein the first solvent comprises one hydroxyl group and has a boiling point of 160° C. to 270° C., the second solvent comprises one hydroxyl group and has a boiling point of 270° C. to 350° C., and the third solvent comprises two or more hydroxyl groups and has a boiling point of 270° C. to 350° C.

2. The ink composition of claim 1, wherein a viscosity at 25° C. of the first solvent is in a range of 1 centipoise to 10 centipoise.

3. The ink composition of claim 1, wherein a viscosity at 25° C. of the second solvent is in a range of 1 centipoise to 20 centipoise.

4. The ink composition of claim 1, wherein a viscosity at 25° C.) of the third solvent is in a range of 50 centipoise to 10,000 centipoise.

5. The ink composition of claim 1, wherein a viscosity at 25° C. of the mixed solvent composition of the first solvent, the second solvent, and the third solvent is in a range of 1 centipoise to 12 centipoise.

6. The ink composition of claim 1, wherein a viscosity at 25° C. of a mixed solvent composition of the second solvent and the third solvent is in a range of 20 centipoise to 1,000 centipoise.

7. The ink composition of claim 1, wherein an amount of the first solvent in the mixed solvent composition of the first solvent, the second solvent, and the third solvent is in a range of 50 volume percent to 75 volume percent.

8. The ink composition of claim 1, wherein the first solvent comprises 4 to 15 carbon atoms and 1 to 3 oxygen atoms excluding the oxygen of the one hydroxy group.

9. The ink composition of claim 1, wherein the second solvent comprises 8 to 18 carbon atoms and 2 or 3 oxygen atoms excluding the oxygens of the one hydroxy group.

10. The ink composition of claim 1, wherein the first solvent comprises 3-methoxy 3-methyl butanol, 3-methoxy butanol, ethylene glycol monobutyl ether, ethylene glycol monoisobutyl ether, ethylene glycol mono t-butyl ether, ethylene glycol monopentyl ether, ethylene glycol monohexyl ether, ethylene glycol monoheptyl ether, ethylene glycol monooctyl ether, diethylene glycol monomethyl ether, diethylene glycol monoethyl ether, diethylene glycol monoisopropyl ether, diethylene glycol monopropyl ether, diethylene glycol monobutyl ether, diethylene glycol monoisobutyl ether, diethylene glycol mono t-butyl ether, diethylene glycol monopentyl ether, diethylene glycol monohexyl ether, diethylene glycol monoheptyl ether, diethylene glycol monooctyl ether, propylene glycol monopentyl ether, propylene glycol monohexyl ether, propylene glycol monoheptyl ether, propylene glycol monooctyl ether, propylene glycol mono 2-ethylhexyl ether, dipropylene glycol monomethyl ether, dipropylene glycol monopropyl ether, dipropylene glycol monoisopropyl ether, dipropylene glycol monobutyl ether, dipropylene glycol monoisobutyl ether, dipropylene glycol mono t-butyl ether, dipropylene glycol monopentyl ether, dipropylene glycol monohexyl ether, triethylene glycol monomethyl ether, triethylene glycol monoethyl ether, triethylene glycol monopropyl ether, triethylene glycol monoisopropyl ether, or any combination thereof.

11. The ink composition of claim 1, wherein the second solvent comprises diethylene glycol 2-ethylpentyl ether, diethylene glycol 1-ethylbutyl ether, diethylene glycol 2-ethylhexyl ether, triethylene glycol monobutyl ether, triethylene glycol monopentyl ether, triethylene glycol monohexyl ether, triethylene glycol monoheptyl ether, triethylene glycol monooctyl ether, triethylene glycol 2-ethylhexyl ether, triethylene glycol 1-ethylpentyl ether, triethylene glycol 1-ethylbutyl ether, dipropylene glycol heptyl ether, dipropylene glycol octyl ether, dipropylene glycol heptyl ether, dipropylene glycol 2-ethylhexyl ether, dipropylene glycol 1-ethylpentyl ether, dipropylene glycol 1-ethylbutyl ether, or any combination thereof.

12. The ink composition of claim 1, wherein the third solvent comprises glycerin, sorbitol, polyethylene glycol with a molecular weight of 400 to 1,100 grams per mole, tetraethylene glycol, or any combination thereof.

13. The ink composition of claim 1, wherein a metal of the metal oxide comprises an alkaline earth metal, a transition metal, a post-transition metal, or any combination thereof.

14. The ink composition of claim 1, wherein the metal oxide comprises ZnO, ZnMgO, $MoO_3$, NiO, $Ni_2O$, $Ni_4O$, $Ni_3O$, $Ni_3O_4$, $Ni_2O_3$, $TiO_2$, $SnO_2$, $Cu_2O$, CuO, $Cu_2O_3$, or any combination thereof.

15. The ink composition of claim 1, wherein a concentration of metal oxide of the ink composition is in a range of 0.01 weight percent to 5 weight percent.

16. The ink composition of claim 1, wherein a viscosity of the ink composition that has been dried under 0.1 Torr to reach 25% to 33% of an initial volume is in a range of 20 centipoise to 1,200 centipoise.

17. A light-emitting device comprising:

a first electrode;

a second electrode facing the first electrode; and an interlayer between the first electrode and the second electrode, the interlayer comprising an emission layer, wherein a layer of the interlayer is prepared by using an ink composition for a light-emitting device, the ink composition comprising:

a metal oxide; and a mixed solvent composition comprising a first solvent, a second solvent, and a third solvent, wherein the first solvent comprises one hydroxyl group and has a boiling point of 160° C. to 270° C., the second solvent comprises one hydroxyl group and has a boiling point of 270° C. to 350° C., and the third solvent comprises two hydroxyl groups and has a boiling point of 270° C. to 350° C.

18. The light-emitting device of claim 17, wherein the emission layer comprises a quantum dot.

19. The light-emitting device of claim 17, wherein the interlayer is an electron transport layer.

20. An electronic apparatus comprising the light-emitting device of claim 17.

* * * * *